United States Patent [19]

Rodgers

[11] Patent Number: 5,029,299

[45] Date of Patent: Jul. 2, 1991

[54] POWER AMPLIFIER WITH CURRENT LIMITING MEANS

[75] Inventor: Robert L. Rodgers, Oklahoma City, Okla.

[73] Assignee: Altec Lansing Corporation, Oklahoma City, Okla.

[21] Appl. No.: 521,122

[22] Filed: May 9, 1990

[51] Int. Cl.$^5$ .............................................. H03F 1/42
[52] U.S. Cl. .................................. 330/298; 330/207 P
[58] Field of Search ...................... 330/207 P, 263, 267, 330/297, 298, 310, 311

[56] References Cited

U.S. PATENT DOCUMENTS 4,714,898 12/1987 Botti et al. ............................ 330/298
4,789,842 12/1988 Naxera ................................. 330/298

Primary Examiner—Steven Mottola
Attorney, Agent, or Firm—Burmeister, York, Palmatier & Zummer

[57] ABSTRACT

A power amplifier provided with overload protection responsive to the impedance of a load falling below a threshold value having a pair of power output devices connected to the load and driven through a balanced operational amplifier and transistor couplers. The operational amplifier has opposed voltage supply inputs, and each is connected through a first resistor to a voltage source and to the load through a pair of diodes connected in series opposition and a second resistor, and the junction between the diodes is connected to the base of one of the transistor couplers. A fault condition causes current to flow through the diodes lowering the potentials of the voltage supply inputs and the bias on the transistor couplers.

12 Claims, 1 Drawing Sheet

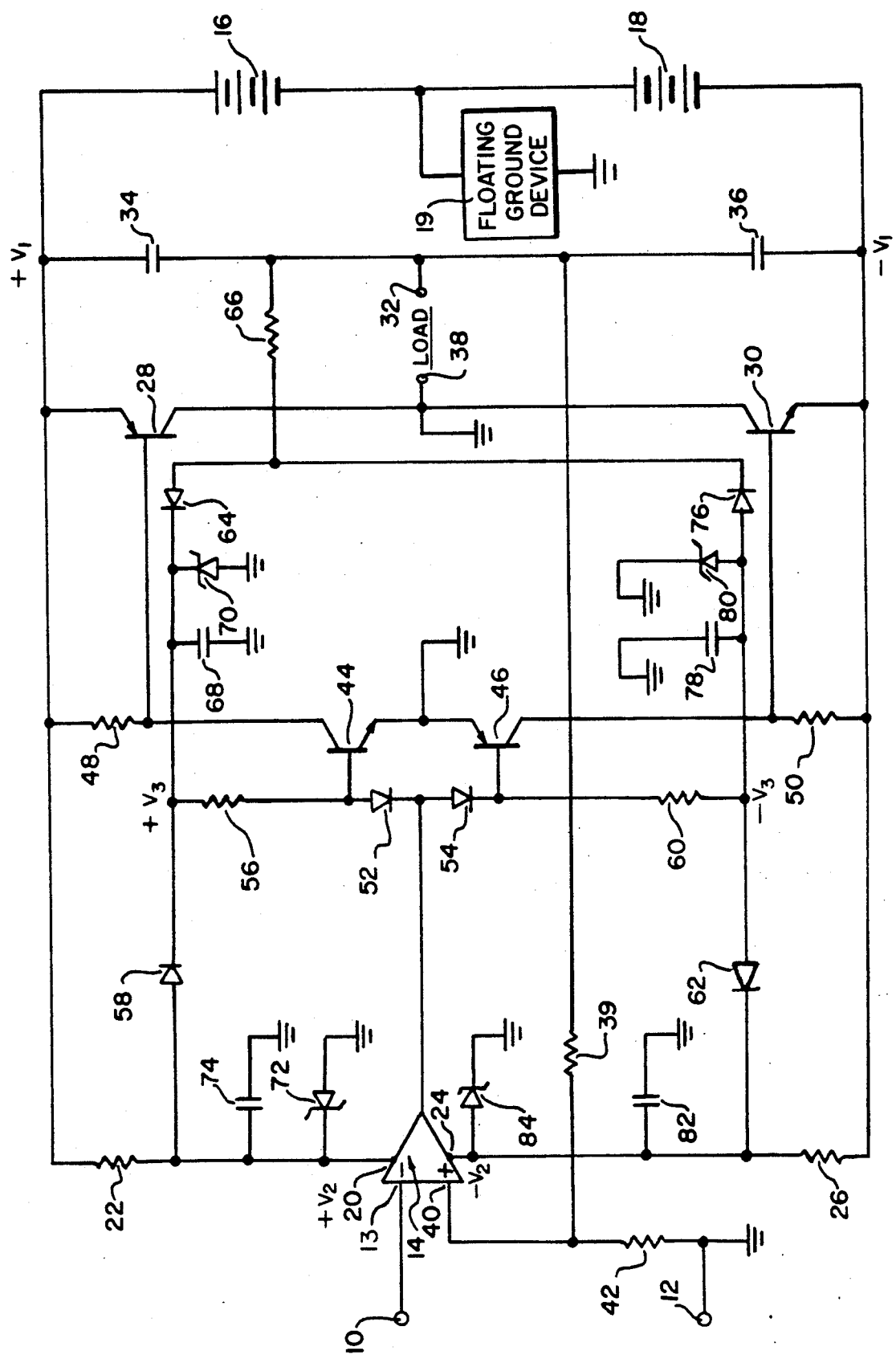

POWER AMPLIFIER WITH CURRENT LIMITING MEANS

BACKGROUND OF THE INVENTION

The present invention relates to power amplifiers particularly adapted for use in sound reproduction provided with means to limit the output current delivered to a load, and particularly to power amplifiers which include a driver for the power output stage of the amplifier which limits the excitation of the output stage responsive to the impedance of the load.

The present invention is an improvement on devices to protect the amplifier against faults in the load of the amplifier, such as a loudspeaker which presents an impedance to the amplifier below the design impedance of the amplifier such that the amplifier will be overloaded when driven to full output. A number of devices exist in the prior art for this purpose, but all of the devices of the prior art possess shortcomings.

One approach to preventing overload of the output devices of a power amplifier has been to incorporate a relay in the circuit which will limit the power dissipation of the output devices responsive to some current or voltage level. The U.S. Pat. No. 4,379,997 of Minora Ooishi et. al. entitled Power Amplifier discloses an amplifier provided with an electronic switch which is responsive to a muting signal to switch the voltage source for the driver to one of two power sources. U.S. Pat. No. 4,173,740 of Yuuichi Nagata et. al. entitled Speaker Protection Circuit is another example of the use of a detection circuit to actuate a relay. Such devices have the disadvantage of interrupting the output of the amplifier for a significant period of time before it can be restored to operating condition.

The Handbook for Sound Engineers, Howard W. Sams & Company 1987, at page 542, describes an audio amplifier in which the current in the emitter circuits of the output devices is monitored to measure the power dissipation of the output devices, and the current excitation to the bases of the output devices is limited if the power dissipation exceeds a particular level to protect the circuit. Circuits of this type in the prior art generally limit the effective dynamic range of the amplifier. In addition, such circuits often create distortion in the audio output from the output devices.

U.S. Pat. No. 4,494,164 of Stan L. Noel entitled Overload Protection Device discloses a similar device for lowering or controlling the excitation to a drive stage of an amplifier, but achieves this function electronically without using a mechanical relay. U.S. Pat. No. 4,789,842 of Jiri Naxera entitled Composite Transistor Device With Over-Current Protection discloses a transistor switch which is responsive to the magnitude of the input signal to clamp the base-emitter of the exciter transistor.

Another approach to protecting the output device of a power amplifier from a load of too low impedance is disclosed in U.S. Pat. No. 4,816,963 of Gary M. Eden entitled Apparatus for Protecting a Transistor in the Event of a Shorted Load Condition which compares a feedback voltage from the load with a reference voltage, and responsive to an overload condition, deactivates the amplifier periodically for short periods of time until the condition is corrected.

U.S. Pat. No. 4,321,554 to Quilter entitled Time-Delayed, Variable Output Current Limiting Means for Power Amplifiers discloses an amplifier with power output devices driven by an operational amplifier. The current output of the operational amplifier is determined by the charge on a capacitor, and that charge is in part determined by a feedback signal from the load to the capacitor which charges the capacitor in direct relation to the impedance of the load.

It is an object of the present invention to avoid the use of disabling relays or electronic switches in order to reduce the output current of the power output devices of a power amplifier responsive to the impedance of the load, and to reduce the output current of the power output devices to a greater extent than is possible with those devices of the prior art which do not use disabling relays or switches.

It is a further object of the present invention to provide a power amplifier with an input stage, an output stage adapted to be coupled to a load, and a transistor coupling stage coupled between the input stage and the output stage, including means responsive to the impedance of the load to reduce the output of both the input stage and the coupling stage when the impedance of the load is below a threshold value.

SUMMARY OF INVENTION

In accordance with the present invention, a power amplifier is provided with a power output means having an output connected to a load and an input connected to an amplifier which drives the power output means. The amplifier has a supply voltage input and the output current of the amplifier is a direct function of the potential on said supply voltage input. The amplifier has a direct current source connected to the supply voltage input, the direct current source having a potential at least equal to the potential required to drive the amplifier to produce the current output to excite the power output means to full output. The amplifier also has means for switching a portion of the current from the source of direct current from the supply voltage input of the amplifier responsive to the load impedance falling below a threshold value. As a result, the amplifier reduces excitation of the power output means when the load impedance is below the threshold value and the power dissipation of the power output means is limited.

Further, the power amplifier is provided with a transistor coupling stage connected between the output of the amplifier and the input of the power output means, and the means for switching a portion of the current from the source of direct current from the supply voltage input of the amplifier provides the bias for the transistors of the coupling stage. The current output of the coupling stage is thus made responsive to the electrical impedance of the load.

BRIEF DESCRIPTION OF THE DRAWING

The drawing consists of a single figure and is an electrical circuit diagram of a power amplifier constructed according to the teachings of the present invention.

DESCRIPTION OF THE PREFERRED EMBODIMENT

As illustrated in the figure, the power amplifier has a pair of input terminals 10 and 12. The terminal 10 is connected to one input 13 of an operational amplifier 14, and the terminal 12 is connected to the common ground. The power amplifier of the present invention utilizes an unregulated power source illustrated as a pair of batteries 16 and 18 connected in series, the negative terminal of battery 16 being connected to the positive terminal of battery 18, and the junction between the batteries 16 and 18 is connected to the common ground by a device 19 which permits the common ground to float with respect to the power source, as is well known. The operational amplifier 14 has a voltage supply terminal 20 which is connected to the positive terminal of battery 16 through a resistor 22. The operational amplifier 14 also has a second voltage supply terminal 24 which is connected to the negative terminal of battery 18 through a resistor 26.

The power amplifier also has a power output means in the form of a transistor amplifier with a first transistor 28 and a second transistor 30. The collectors of the transistor 28 and the transistor 30 are interconnected and connected to the common ground. The emitter of transistor 28 is connected to the positive terminal of battery 16 and to a load terminal 32 through a capacitor 34. The load terminal 32 is also connected to the emitter of transistor 30 through a capacitor 36. A second load terminal 38 is directly connected to the common ground.

The operational amplifier 14 is provided with a negative feedback path from the load terminal 32 through a resistor 39 to the second input 40 of the operational amplifier. A resistor 42 also is connected between the second input 40 and the common ground.

The power output means also includes an amplifier stage with a second pair of transistors 44 and 46. The emitters of the transistors 44 and 46 are interconnected and connected to the common ground. The collector of transistor 44 is connected to the positive terminal of power source 16 through a resistor 48 and the collector of transistor 46 is connected to the negative terminal of power source 18 through a resistor 50.

The operational amplifier 14 has an output which is connected to the base of transistor 44 through a diode 52 and to the base of transistor 46 through a diode 54. Diode 52 is polarized to conduct charges from the base of transistor 44, and diode 54 is polarized to conduct charges to the base of transistor 46. The base of transistor 44 is also connected to the junction between resistor 22 and the first supply voltage input 20 of the operational amplifier 14 through a resistor 56 and a diode 58. In like manner, the base of transistor 46 is connected to the second supply voltage input 24 of the operational amplifier 14 through a resistor 60 and a diode 62.

Resistor 22 and diode 58 are a part of means for switching a portion of the potential from the first supply voltage input 20 of the operational amplifier 14. The first supply voltage input 20 is the positive supply voltage input of the operational amplifier 14, and diode 58 is polarized to conduct positive charges from the first voltage supply input 20. The cathode of the diode 58 is connected to the cathode of a diode 64, and diode 64 is connected through a resistor 66 to the load terminal 32. In addition, a capacitor 68 and a voltage regulator in the form of a zener diode 70 are connected between the junction between the diodes 58 and 64 and the common ground. In like manner, a capacitor 74 and a voltage regulator in the form of a zener diode 72 are connected between the positive supply voltage input 20 of the operational amplifier 14 and the common ground.

The base of transistor 46 is also coupled to the load terminal 32 through a diode 76 and resistor 66. Diode 76 is polarized to transmit charges toward the load terminal 32, while diode 62 is connected to transmit charges toward the second voltage supply input terminal 24. A capacitor 78 and a voltage regulator in the form of a zener diode 80 are connected in parallel between the junction of the diodes 62 and 76 and the common ground. Also, a capacitor 82 and voltage regulating zener diode 84 are connected in parallel between the second voltage supply input terminal 24 and the common ground.

When the amplifier is idling without an input signal, the current through resistor 22 divides and follows two paths. One path extends to the first voltage supply terminal 20 of the operational amplifier 14, and the other path flows through the diode 58. As a result, the potential on the first supply input terminal 20 is depressed and the output of the operational amplifier 14 is reduced, thus reducing the drive on transistors 28 and 30. Further, the bias on the base of transistor 44 is reduced, thus reducing the output from this transistor stage. The current flowing through resistor 26 is also split into two paths in the same manner, and the potentials on the second voltage supply terminal 24 and the base of transistor 46 are depressed. The zener diodes 72, 84, 70 and 80 are not regulating under these conditions and are not functioning in the circuit.

When a signal is applied to the input terminals 10 and 12, with a load connected across the load terminals 32 and 38 of rated impedance or greater, the operational amplifier 14 will drive the transistors 44 and 46, and the transistors will drive the power output transistors 28 and 30 to drive the load. At or near full power signal conditions, a portion of the output signal voltage from the load is conducted through resistor 66 and through diode 64 to produce a voltage on the junction of the diodes 58 and 64 sufficient to permit the zener diode 70 to regulate. Further, the potential of the junction between the diodes 58 and 64 is sufficiently high to back bias diode 58, and all of the current flowing through resistor 22 is available to the first voltage supply terminal 20 of the operational amplifier 14 except for current flowing through the zener diode 72 which has sufficient potential to regulate. Also the bias on the base of transistor 44 is high under these conditions.

In like manner, the junction between diodes 62 and 76 is at a high potential due to a portion of the signal current from the load flowing through resistor 66 and diode 76. Zener diode 80 and zener diode 82 are regulating and diode 62 is back biased. The second voltage supply input 24 of the operational amplifier 14 and the base of transistor 46 are at high potentials to produce maximum current from these amplifier stages.

If the load short circuits the output terminals 32 and 38, the signal voltage developed across the load will be insufficient to forward bias diodes 64 and 76, and these diodes will be reverse biased. Under these conditions, no current flows through the diodes 64 and 76, and the potentials of the junctions between the diodes 58 and 64 and between the diodes 62 and 76 will be sufficiently low that diode 58 and diode 62, respectively, are forward biased. Hence, a portion of the current flowing through resistor 22 to supply voltage terminal 20 of operational amplifier 14 is diverted through diode 58, thus causing the potential on the first voltage supply terminal 20 of the operational amplifier 14 and the bias on the base of transistor 44 to assume a low value. The same effect occurs on the second voltage supply terminal 24 and base of transistor 44. As a result, the current output of the operational amplifier 14 and the transistors 44 and 46 is low, and the power output transistors 28 and 30 are underdriven to reduce the current through the load.

The following potentials were measured on the preferred construction for the positive portion of the circuit, the negative portion being the inverse thereof.

| Condition | Battery 16 | Terminal 20 | Diodes 58, 64 |
|---|---|---|---|
| Idle | +74.5 volts | +8.0 volts | +7.3 volts |
| Max. Power- | | | |
| 8 ohm load | +64.5 volts | +14.0 volts | +14.5 volts |
| 0 ohm load | +67.0 volts | +4.0 volts | +3.3 volts |

The power amplifier described above is effective in reducing the current form the power output devices to the load under conditions of load impedance below the rated value, and it achieves this result with few additional parts and at a low cost.

Those skilled in the art will devise many additional applications and uses for the invention described in this specification. It is therefore intended that the scope of the invention be not limited by the foregoing specification, but only by the appended claims.

The invention claimed is:

1. A power amplifier provided with overload protection comprising, in combination, an input terminal adapted to be connected to a source of electrical signals and an output terminal adapted to be connected to a load, power output means having an input and an output coupled to the output terminal, an amplifier having an input coupled to the input terminal and an output coupled to the input of the power output means, said amplifier having a supply voltage input, the output current of said amplifier being a direct function of the potential on said supply voltage input, a source of direct current electrically connected to the supply voltage input of said amplifier, said direct current source having a potential at least equal to the potential required to drive the amplifier to produce the current output to excite the power output means to full output, and means for switching a portion of the current from the source of direct current from the supply voltage input of the amplifier responsive to the load impedance falling below a threshold value, whereby the amplifier reduces excitation of the power output means when the load impedance is below the threshold value and the power output of the power output means is limited.

2. A power amplifier provided with overload protection comprising the combination of claim 1 wherein the means for switching a portion of the current from the source of direct current from the supply voltage input of the amplifier comprises a first diode and a second diode connected in series opposition, the first diode being connected to the supply voltage input of the amplifier to conduct charges therefrom, and a resistor connected to the load and in series with the first and second diodes, the first and second diodes being back biased during normal operation and conducting during periods in which the load impedance is below a threshold value.

3. A power amplifier provided with overload protection comprising the combination of claim 2 in combination with a voltage regulator connected to the voltage supply input of the amplifier to maintain a fixed maximum potential thereon during periods of normal operation.

4. A power amplifier provided with overload protection comprising the combination of claim 3 wherein the voltage regulator comprises a zener diode and a capacitor connected in parallel.

5. A power amplifier provided with overload protection comprising, in combination, an input terminal adapted to be connected to a source of electrical signals and an output terminal adapted to be connected to a load, power output means having an input and an output coupled to the output terminal, an amplifier having an input coupled to the input terminal and an output coupled to the input of the power output means, said amplifier having a supply voltage input, and the output current of said amplifier being a direct function of the potential on said supply voltage input, a source of direct current, means electrically connecting the source of direct current to the supply voltage input of said amplifier including a first resistive element, said direct current source having a potential at least equal to the potential required to drive the amplifier to produce the current output to excite the power output means to full output, a first diode and a second diode, each diode having a first terminal and a second terminal and being polarized to pass electrical current from the first terminal thereof to the second terminal thereof, the first terminal of the first diode being connected to the supply voltage input of the amplifier and the second terminal of the first diode being connected to the second terminal of the second diode, capacitive means connected to the second terminals of the first and second diodes, and a second resistive element connected between the first terminal of the second diode and the load terminal, the second diode being reverse biased for load impedances higher than a threshold value, whereby during periods in which the load impedance is below the threshold value a portion of the current from the direct current source is diverted from the supply voltage terminal of the amplifier and the potential on the supply voltage terminal is depressed, thus limiting the current output of the amplifier and reducing the current drive for the power output means.

6. A power amplifier provided with overload protection comprising the combination of claim 5 wherein the capacitive means connected to the second terminals of the first and second diodes comprises a capacitor and a voltage regulator connected in parallel.

7. A power amplifier provided with overload protection comprising the combination of claim 6 wherein the regulator comprises a zener diode.

8. A power amplifier provided with overload protection comprising the combination of claim 5 in combination with a transistor coupler electrically connected between the amplifier and the power output means, the transistor coupler having a base electrically connected to the junction between the first and second diodes and the current output of the transistor coupler being directly related to the potential on the base thereof, whereby during periods in which the load impedance is below the threshold value, the second diode becomes forward biased and conducts current from the load to the junction between the first and second diodes, thus reducing this potential and the potential on the base of the transistor coupler to limit the output current thereof.

9. A power amplifier provided with overload protection comprising the combination of claim 8 in combination with a voltage regulator connected to the junction between the first and second diode to maintain a fixed maximum potential thereon during periods of normal operation.

10. A power amplifier provided with overload protection comprising the combination of claim 9 wherein the voltage regulator comprises a zener diode and a capacitor connected in parallel.

11. A power amplifier provided with overload protection comprising, in combination, an input terminal adapted to be connected to a source of electrical signals and an output terminal adapted to be connected to a load, power output means including a pair of power output devices having an input and an output coupled to the output terminal, a balanced operational amplifier having an input coupled to the input terminal and an output electrically coupled to the input of the power output means, said amplifier having two opposed supply voltage inputs, and the output current of said amplifier being a direct function of the potentials on said supply voltage inputs, a first source of direct current, means electrically connecting the first source of direct current to the first supply voltage input of said operational amplifier including a first resistive element, a second source of direct current, a second means electrically connecting the second source of direct current to the second supply voltage input of said operational amplifier including a second resistive element, said first and second direct current sources having potentials at least equal to the potential required to drive the operational amplifier to produce the current output to excite the power output means to full output, a first diode, a second diode, a third diode and a fourth diode, each diode having a first terminal and a second terminal and being polarized to pass electrical current from the first terminal thereof to the second terminal thereof, the first terminal of the first diode being connected to the first supply voltage input of the operational amplifier and the second terminal of the first diode being connected to the second terminal of the second diode, capacitive means connected to the second terminals of the first and second diodes, the first terminal of the third diode being connected to the second supply voltage input of the operational amplifier and the second terminal of the third diode being connected to the second terminal of the fourth diode, capacitive means connected to the second terminals of the third and fourth diodes, and a second resistive element connected between the first terminal of the second diode and the first terminal of the fourth diode and the load terminal, the second diode and the fourth diode being reverse biased for load impedances higher than a threshold value and forward biased for load impedances below the threshold value, whereby during periods in which the load impedance is below the threshold value portions of the current from the direct current sources are diverted from the supply voltage terminals of the operational amplifier and the potential on the supply voltage terminals are depressed, thus limiting the current output of the amplifier and reducing the current drive for the power output means.

12. A power amplifier provided with overload protection comprising the combination of claim 11 in combination with a coupler having a first and a second transistor electrically connected between the operational amplifier and the output means, the first transistor having a base electrically connected to the junction between the first and second diodes, and the second transistor having a base electrically connected to the junction between the third and fourth diodes, the current output of the coupler being a direct function of the potential on the bases of the first and second transistors, whereby during periods in which the load impedance is below the threshold value, the potentials of the junctions between the first and second diode and third and fourth diodes falls reducing the potentials on the bases of the first and second transistors, thus limiting the current output of the coupler and reducing the current drive for the power output means.

* * * * *